(12) United States Patent
Gaskins et al.

(10) Patent No.: US 7,900,129 B2
(45) Date of Patent: *Mar. 1, 2011

(54) ENCODED MECHANISM FOR SOURCE SYNCHRONOUS STROBE LOCKOUT

(75) Inventors: Darius D. Gaskins, Austin, TX (US); James R. Lundberg, Austin, TX (US)

(73) Assignee: VIA Technologies, Inc., Taipei (TW)

(*) Notice: Subject to any disclaimer, the term of this patent is extended or adjusted under 35 U.S.C. 154(b) by 882 days.

This patent is subject to a terminal disclaimer.

(21) Appl. No.: 11/687,861

(22) Filed: Mar. 19, 2007

(65) Prior Publication Data

US 2008/0180147 A1    Jul. 31, 2008

Related U.S. Application Data

(60) Provisional application No. 60/887,009, filed on Jan. 29, 2007.

(51) Int. Cl.
*G06F 11/00* (2006.01)
*H03M 13/00* (2006.01)

(52) U.S. Cl. ............ 714/815; 327/152; 327/158; 713/401; 710/61

(58) Field of Classification Search ......... 714/814–815; 327/158, 152, 161, 162; 710/61; 713/401
See application file for complete search history.

(56) References Cited

U.S. PATENT DOCUMENTS

| | | | |
|---|---|---|---|
| 6,025,744 | A | 2/2000 | Bertolet et al. |
| 6,307,877 | B1 | 10/2001 | Philips et al. |
| 6,377,097 | B1 | 4/2002 | Shuler, Jr. |
| 6,433,600 | B2 | 8/2002 | Ilkbahar |
| 6,505,262 | B1 | 1/2003 | Kurd et al. |
| 6,697,420 | B1 | 2/2004 | Simon et al. |
| 6,804,800 | B2 | 10/2004 | Rodriguez |
| 6,832,325 | B2 | 12/2004 | Liu |
| 7,003,686 | B2 | 2/2006 | Chua-Eoan et al. |

(Continued)

OTHER PUBLICATIONS

Park, Joonbae et al. "A Semi-digital Delay Locked Loop for Clock Skew Minimization." Proceedings Twelfth International Conference on VLSI Design. 1999. Publicaiton Date: Jan. 7-10, 1999. On pp. 584-588. Meeting Date Jan. 7, 1999-Jan. 10, 1999 Location: Goa, India.

(Continued)

*Primary Examiner*—Guy J Lamarre
(74) *Attorney, Agent, or Firm*—Richard K. Huffman; James W. Huffman (57) ABSTRACT

An apparatus for locking out a source synchronous strobe receiver, including a delay-locked loop (DLL) and receivers. The DLL receives a reference clock, and generates a select vector and an encoded select vector. The select vector is employed to select a delayed version of the reference clock that lags the reference clock by a prescribed number of cycles. The select vector is reduced by an amount and is gray encoded to indicate the lockout time. The receivers are each coupled to the delay-locked loop. Each of the receivers receives the encoded select vector and a corresponding strobe, and locks out reception of the corresponding strobe for the lockout time following transition of the corresponding strobe. The encoded select vector is employed by a gray code mux therein to determine the lockout time by selecting a delayed version of the corresponding strobe.

25 Claims, 7 Drawing Sheets

U.S. PATENT DOCUMENTS

| | | |
|---|---|---|
| 7,271,634 B1 | 9/2007 | Daga et al. |
| 7,280,417 B2 | 10/2007 | Choi et al. |
| 7,283,380 B1 | 10/2007 | Srinivasan et al. |
| 7,453,297 B1 | 11/2008 | Kaviani |
| 7,543,090 B2 * | 6/2009 | Lundberg .................... 710/61 |
| 2002/0087911 A1 | 7/2002 | Liu |
| 2004/0113654 A1 | 6/2004 | Lundberg |
| 2007/0001724 A1 | 1/2007 | Na |
| 2007/0136619 A1 | 6/2007 | Chen et al. |
| 2007/0217559 A1 | 9/2007 | Stott et al. |
| 2008/0013663 A1 | 1/2008 | Cornelius et al. |

OTHER PUBLICATIONS

Yamaoto, Kazuhiro et al. "Multi Strobe Circuit for 2.133 GHz Memory Test System." Test Conference, 2006. ITC '06. IEEE International Oct. 2006, pp. 1-9.

Wang et al. "All-Digital Delay-Locked Loop/Pulsewidth-Control Loop with Adjustable Duty Cycles." IEEE Journal of Solid-State Circuits. V. 41, No. 6. Jun. 2006.

"A Semi-Digital Delay Locked Loop for Clock Skew Minimization." (undated), downloaded from IEEE Xplore on Nov. 19, 2008.

* cited by examiner

FIG. 1 (Prior Art)

STROBED BUS ARCHITECTURE

FIG. 2 (Prior Art)

STROBED BUS TIMING DIAGRAM

FIG. 3 (Prior Art)
QUAD-PUMPED SOURCE SYNCHRONOUS DATA PHASE FOR 64-BYTE TRANSFER

RIGHT 4-TO-1 MUX ELEMENT

ENCODED MECHANISM FOR SOURCE SYNCHRONOUS STROBE LOCKOUT

CROSS-REFERENCE TO RELATED APPLICATIONS

This application claims the benefit of the following U.S. Provisional Applications, each of which is herein incorporated by reference for all intents and purposes.

| SERIAL NUMBER | FILING DATE | TITLE |
| --- | --- | --- |
| 60/887,009 (CNTR.2296) | Jan. 29, 2007 | ENCODED MECHANISM FOR SOURCE SYNCHRONOUS STROBE LOCKOUT |

This application is related to the following co-pending U.S. Patent Applications, each of which has a common assignee and common inventors.

| SERIAL NUMBER | FILING DATE | TITLE |
| --- | --- | --- |
| 11/687,810 (CNTR.2280) | Mar. 19, 2007 | APPARATUS AND METHOD FOR LOCKING OUT A SOURCE SYNCHRONOUS STROBE RECEIVER |
| 11/687,842 (CNTR.2295) | Mar. 19, 2007 | ADJUSTMENT MECHANISM FOR SOURCE SYNCHRONOUS STROBE LOCKOUT |
| 11/687,899 (CNTR.2297) | Mar. 19, 2007 | DOUBLE-PUMPED/QUAD-PUMPED VARIATION MECHANISM FOR SOURCE SYNCHRONOUS STROBE LOCKOUT |
| 11/687,915 (CNTR.2406) | Mar. 19, 2007 | RECEIVER MECHANISM FOR SOURCE SYNCHRONOUS STROBE LOCKOUT |

BACKGROUND OF THE INVENTION

1. Field of the Invention

This invention relates in general to the field of microelectronics, and more particularly to apparatus and methods for locking out a source synchronous strobe receiver to preclude erroneous indications resulting from bus noise in a microprocessor system that employs source synchronous data and address buses which furthermore provides a mechanism to adjust timing values to compensate for fabrication process variations or other post-fabrication issues.

2. Description of the Related Art

A present day computer system employs a source synchronous system bus to provide for exchange of data between bus agents, such as between a microprocessor and a memory hub. A "source synchronous" bus protocol allows for the transfer of data at very high bus speeds. Source synchronous protocols operate on the principle that a transmitting bus agent places data out on the bus for a fixed time period and asserts a "strobe" signal corresponding to the data to indicate to a receiving bus agent that the data is valid. Both data signals and their corresponding strobe are routed over the bus by the same propagation path, thus enabling a receiver to be relatively certain that when transition of the corresponding strobe is detected, data is valid on the data signals.

But data strobes are subject to error resulting from a number of sources including, but not limited to, conducted and radiated emissions from other signals in close proximity. And whereas former bus protocols provided sampling mechanisms to detect and correct errors on the bus, errors due to data strobe glitches on a source synchronous bus are considered more complex because there is no absolute time reference, such as was provided for in former bus protocols by a number of bus clock cycles, that can be relied upon to determine if a transition on a strobe signal is a real transition or a glitch. In present day source synchronous buses, several bursts of data are transmitted during a single bus clock cycle, and the only indication provided to a receiving bus agent that data is valid is the data strobe itself. The timing of strobe transitions is a function of the bus clock frequency, but at a receiver the switching of a data strobe seems, for all intents and purposes, to be asynchronous to the bus clock. This is because there is a fixed, but unknown, phase difference between the bus clock and the data strobes.

Consequently, a number of techniques have been provided to detect and correct glitches that occur in the strobes over source synchronous buses. One class of techniques for is of interest in the present application, that is, so-called "receiver lockout" techniques. As noted above, source synchronous bus protocols often specify a fraction of a bus clock cycle for strobing of data. Consider the specific case where a data strobe cycle is constrained to be ¼ of a bus clock cycle. Extant techniques provide a number of mechanisms to lock out a receiver for a period of time equal to ¼ cycle of the bus clock. But these techniques employ fixed logic, typically a string of inventors, to calculate the lockout time and, consequently, when operating parameters change, such as slight variations in bus clock frequency, variations in device temperature, and variations in core operating voltage, lockout time is adversely affected. In addition, fabrication process variations can cause lockout time to vary from part to part. Thus, designers are forced to employ worst-case scenarios to employ these techniques.

The present inventors have noted that conventional receiver lockout techniques are deficient because they do not provide any compensation for the above noted variations, and thus a substandard mechanism is provided through which error is introduced into a computer system design.

Accordingly, what is needed are apparatus and methods that enable a receiving device to lock out reception of a period of time following valid detection of a source synchronous strobe, where the period of time is continually updated to account for variations in bus and core voltages, temperature, and changes in bus clock frequency.

What is also needed are techniques for source synchronous strobe lockout that provide compensation for variations in fabrication processes, at the lot, wafer, and cross-die levels.

What is moreover needed is a mechanism to adjust lockout time to compensate for variations due to fabrication process and/or testing of parts.

Furthermore, what is need is a mechanism to prevent inadvertent enablement of receiver paths due to spurious noise.

SUMMARY OF THE INVENTION

The present invention, among other applications, is directed to solving the above-noted problems and addresses other problems, disadvantages, and limitations of the prior art.

The present invention provides a superior technique for locking out a source synchronous strobe receiver that is continually updated to compensate for variations in bus clock frequency, voltage, and temperature. In one embodiment, an apparatus for precluding reception errors in an source synchronous receiver is provided. The apparatus includes a delay-locked loop and one or more strobe receivers. The delay-locked loop receives a reference clock signal and generates a select vector signal and an encoded select vector signal, where the encoded select vector signal indicates a lockout time period, and where the select vector signal is employed to select, one of a plurality of successively delayed versions of the reference clock signal that lags the reference clock signal by a prescribed number of cycles of the reference clock signal, and where the lockout time period is slightly less than the prescribed number of cycles of the reference clock signal. The delay-locked loop has a gray encoder that generates the encoded select vector signal according to a gray code. The one or more strobe receivers are each coupled to the delay-locked loop. Each of the one or more strobe receivers receives the encoded select vector signal and a corresponding strobe signal, where the each is configured to lock out reception of the corresponding strobe signal for the lockout time period following transition of the corresponding strobe signal, and where the encoded select vector signal is employed to determine the lockout time period by selecting one of a plurality of successively delayed versions of the corresponding strobe signal, and where the each comprises a gray code mux to select the one of a plurality of successively delayed versions of the corresponding strobe signal according to the encoded select vector signal.

One aspect of the present invention contemplates a microprocessor apparatus for locking out a source synchronous strobe receiver. The microprocessor apparatus has a delay-locked loop and a strobe receiver. The delay-locked loop receives a reference clock signal, and generates a select vector signal and an encoded select vector signal, where the encoded select vector signal indicates a lockout time period, and where the select vector signal is employed to select one of a plurality of successively delayed versions of the reference clock signal that lags the reference clock signal by a prescribed number of cycles of the reference clock signal, and where the lockout time period is slightly less than the prescribed number of cycles of the reference clock signal. The delay-locked loop includes a delay element that has a first plurality of taps. Each of the first plurality of taps corresponds to each of the plurality of successively delayed versions of the reference clock signal. The delay-locked loop also has a gray encoder that generates the encoded select vector signal according to a gray code. The a strobe receiver is coupled to the delay-locked loop. The strobe receiver receives the encoded select vector signal and a strobe signal, and locks out reception of the strobe signal for the lockout time period following transition of the strobe signal. The encoded select vector signal is employed to determine the lockout time period by selecting one of a plurality of successively delayed versions of the strobe signal. The strobe receiver has a replica delay element having a second plurality of taps. Each of the second plurality of taps corresponds to each of the plurality of successively delayed versions of the strobe signal, where the first and second plurality of taps are equal in number. The strobe receiver also has a gray code mux that is configured to select the one of a plurality of successively delayed versions of the strobe signal according to the encoded select vector signal.

Another aspect of the present invention comprehends a method for lockout of a source synchronous strobe receiver. The method includes first generating successively delayed versions of a reference clock signal and selecting one of the successively delayed versions of the reference clock signal that lags the reference clock signal by a prescribed number of cycles of the reference clock signal; first indicating the one of the successively delayed versions of the reference clock signal via a select vector; second generating a gray encoded select vector that indicates a lockout time period; and in a strobe receiver, locking out reception of a strobe signal for the lockout time period following transition of the strobe signal.

The locking out includes third generating successively delayed versions of the strobe signal and employing the gray encoded select vector to determine the lockout time period by selecting one of the successively delayed versions of the strobe signal.

BRIEF DESCRIPTION OF THE DRAWINGS

These and other objects, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
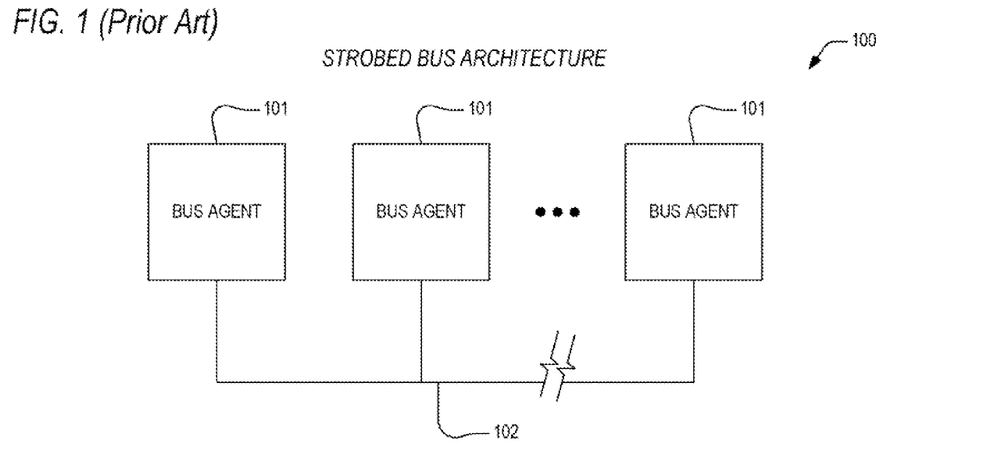
FIG. 1 is a block diagram illustrating a present day computer system where two or more bus agents exchange data over a source synchronous system bus.
Figure 2:
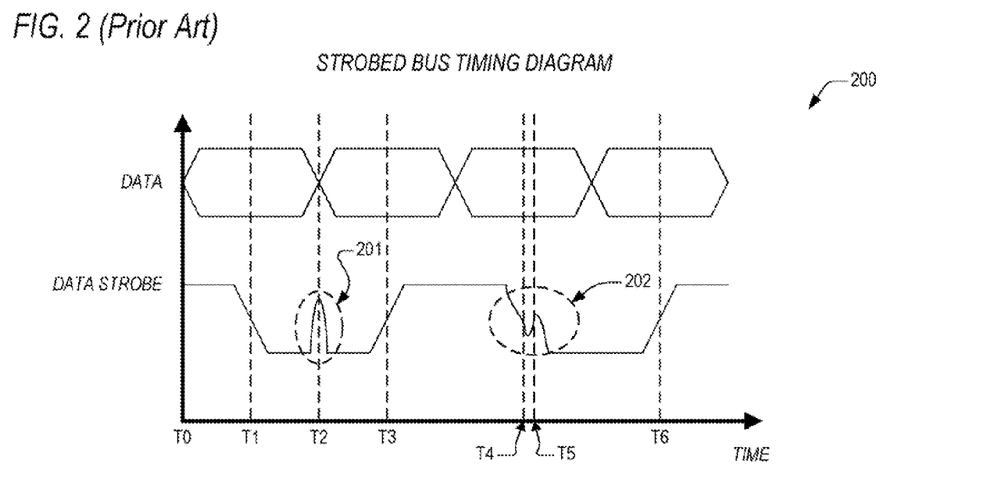
FIG. 2 is a timing diagram depicting how a source synchronous data strobe is employed via the system bus of FIG. 1 to transfer data between the bus agents.

In view of the above background discussion on present day techniques that are employed within present day integrated circuits for the detection and correction of errors that occur in a source synchronous system bus, a discussion of the limitations and disadvantages of these techniques will now be presented with reference to FIGS. 1-2. Following this, a discussion of the present invention will be presented with reference to FIGS. 3-5. The present invention provides a superior technique for locking out reception of source synchronous data and address strobe signals during intervals in which they are subject to erroneous state changes due primarily to cross-coupled bus noise. Unlike extant techniques, the lockout interval according to the present invention is dynamically updated to compensate for variations in bus frequency, voltage, temperature, and cross-die process.

Turning to FIG. 1, a block diagram is presented illustrating a present day computer system 100 where two or more bus agents 101 exchange data over a source synchronous system bus 102. The bus agents 101 may be any element or elements of the computer system 1000 that are employed to transmit or receive data via the bus 102. As one skilled in the art will appreciate, a typical present day bus agent 101 may be embodied as, but not limited to a microprocessor or central processing unit, a memory hub or memory controller, a master or slave peripheral device, a direct memory access unit, a video controller, or another type of bus interface unit. In broad terms, to transfer data, one of the bus agents 101 will drive a subset of the signals on the bus 102 while another of the bus agents 101 detects and receives the driven signals, thus capturing the data that is represented by the states of one or more of the subset of the signals on the bus 102. There are a number of different bus protocols represented in the present day art for transferring data between two bus agents, and it is beyond the scope of this application to provide a detailed description of these various techniques. It is sufficient herein to appreciate that the "data" which is communicated between two or more bus agents 101 during a bus transaction may include, but not be limited to, address information, data that is associated with one or more addresses, control information, or status information. Regardless of the type of data that is communicated over the bus, it is germane to this application that more and more present day computer systems 100 are employing a particular type of bus protocol commonly known as "source synchronous" protocol, to effect the transfer of data at very high bus speeds. In contrast to prior art, sampled data bus protocols, source synchronous protocols operate on the principle that a transmitting bus agent 101 places data out on the bus for a fixed time period and asserts a "strobe" signal corresponding to the data to indicate to a receiving bus agent 101 that the data is valid. One skilled in the art will appreciate that the propagation path, to include physical and electrical parameters, of one set of data and corresponding strobe signals, at very high transfer speeds, may very well be quite different from the propagation path that is associated with another set of signals on the bus. In particular, propagation delay, bus impedance, and electrical characteristics of a propagation path affect the time at which the data signals are stable, or "valid" for reception by the receiving bus agent 101. It is for this reason that source synchronous bus protocols are gaining prevalence in the market of fielded devices. In a typical configuration, a data strobe that is associated with a corresponding set of data signals is routed along the same propagation path as the set of data signals, and thus the strobe sees the same propagation characteristics as the data signals themselves. If the strobe is asserted during the period in which the data is valid, when the receiving bus agent 101 detects a valid transition of the strobe, it relatively certain that the data signals will be valid as well.

Now referring to FIG. 2, a timing diagram 200 is presented, depicting how a source synchronous data strobe is employed via the system bus of FIG. 1 to transfer data between the bus agents 101. The diagram 200 shows one or more data signals DATA along with a corresponding data strobe DATA STROBE, which comprise a subset of the signals on the system bus 102 of FIG. 1. As noted above, DATA STROBE is routed along the same propagation path as DATA, so that they both experience, or "see," the same propagation characteristics. As allude to above, the states of DATA are driven on the bus during a fixed or predetermined time window. In the diagram 200, DATA is driven at time T0 and is driven again at time T2. DATA STROBE is driven at time T1 to indicate the validity of the information on DATA which was driven at T0. Likewise, DATA STROBE is driven at time T3 to indicate the validity of the information on DATA which was driven at T2.

It is noted that the information on DATA is changed at T2 from that which was driven at T0. And so on.

A source synchronous data bus generally assets DATA STROBE at some time after DATA has been sourced to the bus to compensate for slight variations in propagation characteristics between DATA and DATA STROBE. Often times, DATA STROBE is asserted halfway through the period in which DATA is sourced to the bus. The receiving bus agent captures DATA when it detects a predetermined change in the state of DATA STROBE, typically when DATA STROBE transitions through a voltage or current level that corresponds to assertion of DATA STROBE. Source synchronous buses are effective at high bus speeds because the variations in propagation distance and bus design that affect the timing of DATA are virtually the same as those which affect the timing of DATA STROBE. Accordingly, DATA is deemed valid at a receiving bus agent when the assertion of DATA STROBE is detected.

Although source synchronous buses are advantageous from the perspective of maximizing data transfer rates, they are still subject to errors. More specifically, one skilled in the art will appreciate that any number of phenomena on the bus can cause a "glitch" 201 in the DATA STROBE, as seen by a receiving bus agent. For purposes of this application, a glitch 201, 202 is an unintended transition or assertion of DATA STROBE. Depending upon the particular type of source synchronous protocol that is employed, the glitches 201, 202 shown at times T2 and T5, if detected by a receiving bus agent, may cause the agent to interpret the states of DATA which were strobed valid at times T1 and T4 as those which are yet to be strobed valid at times T3 and T6. Glitches 201, 202 are caused by directly or indirectly coupled noise on the bus that results from the state changes of other signals within the integrated circuit or computer system. In particular, the glitch 201 shown at time T2 results from transition of the data signals DATA which are switched at that time as well. The glitch 201 at time T2 is very common for source synchronous buses.

Many techniques have been provided for the detection and correction of glitches on source synchronous buses. Indeed, there are several techniques that are provided that preclude a receiving bus agent from experiencing a glitch 201, 202 once a valid assertion of DATA STROBE has been detected. For example, Ilkhahar in U.S. Pat. No. 6,433,600 teaches a method and apparatus for glitch protection in differential strobe input buffers in a source-synchronous environment that provides glitch protection for a predetermined (i.e., fixed) period of time following transition of a corresponding data strobe. Kurd et al., in U.S. Pat. No. 6,505,262, teach a glitch protection circuit that generates an output representing a logical multiplication of a strobe signal with a delayed version of itself. Kurd also teaches a pair of glitch protection circuits that each sense a strobe transition and become dormant until its partner senses a strobe transition, where the pair operates in a toggling fashion. In both of these patents, and other sources of techniques extant in the art, logic circuits are employed that provide a fixed period of time (often embodied as a cascaded string of inverters) during which a strobe signal is locked out following a valid transition.

The present inventors have observed that conventional techniques for precluding glitches in a source synchronous receiver are limited because of the fixed timing techniques that are employed. As one skilled in the art will appreciate, the timing of signals on any bus varies as a function of bus voltage, core voltage on the receiving bus agent, and temperature. In addition, the frequency of a bus clock signal, from which the source synchronous strobe signals are derived, varies as well. Furthermore, fabrication process variations will result in one timing circuit in a given device exhibiting an entirely different "lockout" time than the very same timing circuit on another device produced on the same or different wafer. In addition, since data strobes and associated data are received asynchronously relative to other signals on the bus, such as a bus clock signal, there is no known technique available for indicating a precise period of time for which reception of a strobe is deemed unreliable.

Consequently, the present inventors have noted that present day techniques for locking out reception of data strobe signals are deficient and limiting because these techniques do not take into account for variations in timing dues to the above noted reasons. A device that employs these present day techniques must be configured to operated under worst-case conditions, thus reducing their effectiveness, or they must be tuned during fabrication and test. Both of these compensation techniques are disadvantageous and add cost to a system.

Accordingly, the present inventors have noted that it is very desirable to provide apparatus and methods that enable a receiving device to lock out reception of a period of time following valid detection of a source synchronous strobe, where the period of time is continually updated to account for variations in bus and core voltages, temperature, and changes in bus clock frequency.

In addition, the present inventors have sensed a need in the art to provide techniques for adjusting the period of time when a device is manufactured, or tested, or installed so that issues that may arise following fabrication can be addressed.

Moreover, it is required that any provided lockout apparatus be configured to preclude inadvertent enablement of receiver paths due to noise or glitches which may arise from dynamic update operations.

The present invention overcomes these noted limitations in the art, and others, by providing a dynamic source synchronous strobe receiving apparatus and methods having a dynamic lockout interval that is based upon application of a delay-locked loop (DLL) to an on-chip clock that is derived from the bus clock, and which is used for clock transmission of data strobes and associated data according source synchronous protocol. The present invention will now be discussed with reference to FIGS. 3-5.

Figure 3:
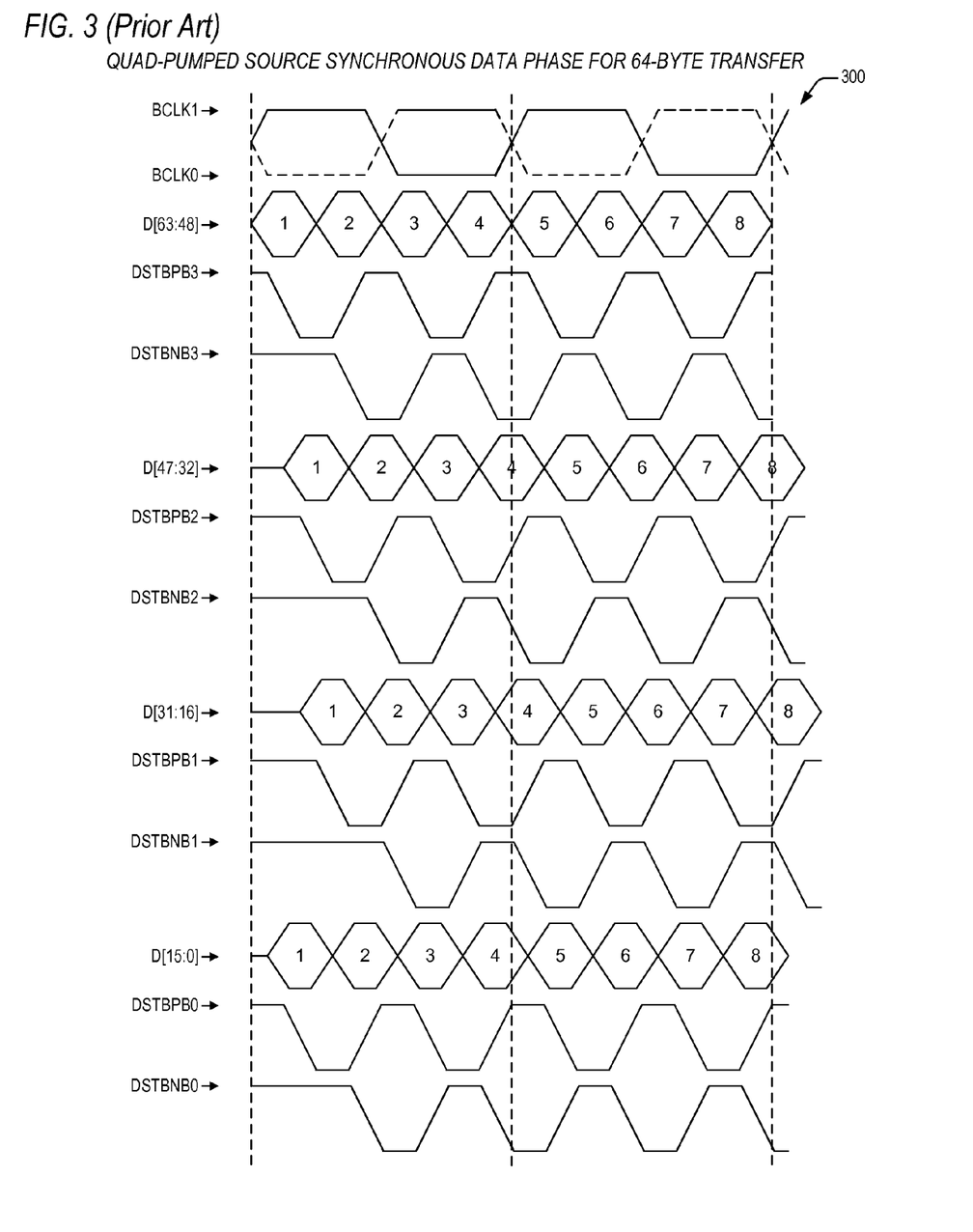
FIG. 3 is a timing diagram featuring interaction of signals within an x86-compatible data signal group for performing the data phase of a 64-byte bus transaction.

Referring to FIG. 3, a timing diagram 300 is presented featuring interaction of signals within an x86-compatible data signal group for performing the data phase of a 64-byte bus transaction. The timing diagram 300 of FIG. 3 is provided to disclose a specific embodiment of the present invention for which dynamic lockout of a receiver is configured, although the present inventors note that the scope of the present invention extends beyond that specific bus protocol presented. The x86-compatible source synchronous protocol is ubiquitous and well-known in the art, and thus provides a familiar foundation to teach essential concepts of the present invention. The timing diagram 300 shows interaction of signals within an x86-compatible data signal group for performing the data phase of a bus transaction. Operation of such transactions and corresponding signals as named herein in an x86-compatible microprocessor are described in numerous references, one of which is the book "The Unabridged Pentium®4 IA32 Processor Genealogy, 1st Edition," by Tom Shanley.

For clarity, assertion of signals is shown in the diagram 300 as a logic low level, although one skilled in the art will appreciate that assertion can as well be indicated by a logic high level, or by toggling between a high and low levels. Cycles of a differential bus clock BCLK[1:0], as discussed above, are shown across the top of the timing diagram 300.

The x86-compatible source synchronous protocol provides for a 64-bit data bus D[63:0] that supports transfer during the data phase of a 64-byte cache line over two cycles of the bus clock BCLK[1:0] though the employment of source synchronous data strobe signals DSTBPB[3:0], DSTBNB[3:0]. The transfer of eight bytes over the 64-bit data bus D[63:0] is known as a beat and 4 beats 1-4, 5-8 are transferred during each cycle of the bus clock BCLK[1:0]. In addition, the data bus signal group is divided into four subgroups comprising data and strobe signals. Signals within a subgroup are routed through the same propagation path. Subgroup 0 includes D[15:0], DSTBPB0, and DSTBNB0. Subgroup 1 includes D[31:16], DSTBPB1, and DSTBNB1. Subgroup 2 includes D[47:32], DSTBPB2, and DSTBNB2. And subgroup 3 includes D[63:48], DSTBPB3, and DSTBNB3. The felling edges of data strobe DSTBPB0 are used to indicate validity of words 1, 3, 5, and 7 on D[15:0]. The falling edges of data strobe DSTBNB0 are used to indicate validity of words 2, 4, 6, and 8 on D[15:0]. The falling edges of data strobe DSTBPB1 are used to indicate validity of words 1, 3, 5, and 7 on D[31:16]. The falling edges of data strobe data strobe DSTBNB1 are used to indicate validity of words 2, 4, 6, and 8 on D[31:16]. The failing edges of data strobe DSTBPB2 are used to indicate validity of words 1, 3, 5, and 7 on D[47:32]. The falling edges of data strobe DSTBNB2 are used to indicate validity of words 2, 4, 6, and 8 on D[47:32]. The falling edges of data strobe data strobe DSTBPB3 are used to indicate validity of words 1, 3, 5, and 7 on D[63:48]. And the falling edges of data strobe DSTBNB3 are used to indicate validity of words 2, 4, 6, and 8 on D[63:48]. Note that the frequency of the data strobe signals DSTBPB[3:0], DSTBNB[3:0] is twice that of the bus clock BCLK[1:0] and that the two strobes within each corresponding pair of strobes (e.g., DSTBPB0 and DSTBNB0) exhibit a relative ½-cycle lag. Consequently, the x86-compatible bus protocol supports transfer of four sets (i.e., beats) of data on the same data subgroup during a single bus clock cycle. The signals noted above are presented to teach aspects of the present invention, however, as one skilled in the art will appreciate, the x86-compatible synchronous data bus comprises several other signals (e.g., DINVB[3:0]), but for clarity purposes, but these additional signals are not discussed herein.

As one skilled in the art will acknowledge, the transmitter of the data (e.g., microprocessor, chipset, or other bus agent), places the data D[XX:XX] for the associated subgroup on the bus and then asserts the corresponding data strobe DSTBXB# to indicate validity of the data. Hence, in contrast to older, sampled data/address buses, where data was placed on the bus and held for a sampling period, the present bus technologies strobe data out over bus subgroups in eight bursts, where the validity of each burst is indicated by the state of the corresponding strobe DSTBXB#, and since the corresponding strobe DSTBXB# is routed along the same propagation path as its associated data signals D[XX:XX], it is virtually certain that when a receiver detects assertion of the data strobe DSTBXB#, the associated data D[XX:XX] will be valid—in the absence of glitches or other errors on the bus that may occur.

From the perspective of a receiver, assertions of the data/address strobes DSTBXB# appear to be indeterminate with respect to assertions of the bus clock BCLK#, but as alluded to above, the period for each of the data strobes DSTBXB# is equal to approximately one-half of the period of the bus clock BCLK#. In current implementations, an x86-compatible data bus (as shown) strobes out 8 bursts of data signal groups over a period of two bus clocks, while an x86-compatible address bus (not shown) strobes out either 4 or 8 bursts of address signal groups, depending upon implementation, over a period of two bus clocks. Implementations that strobe out 4 bursts of data or address information within a single bus clock cycle are referred to as "quad-pumped" buses. Implementations that strobe out 2 bursts of data or address information within a single bus clock cycle are referred to as "double-pumped" buses. Consequently, the period for each of the address strobes for a double-pumped address bus is approximately equal to the period of the bus clock BCLK#. As previously mentioned, the timing of data and strobe transitions is indeed a function of the bus clock frequency, but at a receiver the switching of a data strobe seems, for all intents and purposes, to be asynchronous to the bus clock. This is because there is a fixed, but unknown, phase difference between the bus clock and the data strobes. Such a case is illustrated in the diagram 300 of FIG. 3. Note that the transitions of D[63:48] and associated strobes DSTBPB3, DSTBNB3 appear to be in phase with the transitions of BCLK[1:0] while the transitions of the remaining signal groups appear to have no phase relationship with BCLK[1:0] whatsoever. This may be due to that manner in which a transmitting devices transfers data over the bus, or it may be due to varying propagation path lengths for each signal group, or it may be due to both transmitter characteristics and propagation path lengths.

As previously noted, a strobe receiver in a microprocessor or other device coupled to a source synchronous bus is subject to noise on the bus which may result in a strobe signal being erroneously received, as is depicted by the glitch 201, 202 in FIG. 2. For example, if a data strobe, say DSTBPB0 in FIG. 3, is asserted to indicate validity of burst 1 on D[15:0], and then noise on the bus couples on to DSTBPB0 prior to its assertion to indicate validity of data for burst 3, then an open receiver (i.e., a receiver that is enabled to detect subsequent transitions of DSTBPB0 subsequent to detection of the previous transition) may erroneously indicate an additional assertion of DSTBPB0, thus causing an error in data reception. The timing diagram 300 of FIG. 3 aptly illustrates the complex nature of data signals and their corresponding data strobes within multiple signal groups for 64-bit source synchronous data bus configuration, and thus, it is emphasized that a technique for precisely locking out a strobe receiver from reception of erroneous transitions is highly desirable in the art, where the lockout time is dynamically adjusted to compensate for timing variations due to changes voltage, temperature, process, and bus clock frequency.

The present invention provides for lockout of a synchronous strobe signal DSTBPB[3:0], DSTBNB[3:0] during the period in which it is most susceptible to state transitions due to bus noise. In the x86-compatible bus illustrated by the timing diagram 300, this period of time is one fourth of the period of the bus clock signal BCLK[1:0]. According to the present invention, an open data strobe signal receiver detects assertion of a data strobe DSTBPB[3:0], DSTBNB[3:0], and then locks out reception of any transitions of that data strobe DSTBPB[3:0], DSTBNB[3:0] on the bus for a period that is equal to or less than one-fourth of the period of the bus clock BCLK[1:0]. Following the lockout, lockout logic opens up the receiver to allow it to receive subsequent assertions of the data strobe signal DSTBPB[3:0], DSTBNB[3:0]. The present invention employs a delay-locked loop (DLL) that is clocked by an on-board 8x derivative of the bus clock. BCLK[1:0] signal, which is known as DCLK (not shown). In one embodiment, the DLL employs a 64-tap delay element that generates 64 successively delayed versions of DCLK. The DLL and associated logic selects one of the 64 delayed versions and generates a 6-bit select vector signal that corresponds to the selected version of DCLK that is closest to, but does not exceed, two periods of the signal DCLK. Adjust logic is also included to subtract a small value of from the 6-bit select vector in order to compensate for fabrication process and other variations. The small value is provided via ADJVAL logic that is disposed elsewhere in the integrated circuit or is located off the chip altogether. An adjusted select vector, continuously updated, is then distributed to data strobe receivers on the integrated circuit or device. Each of the data strobe receivers includes a replica of the 64-tap delay element and mux logic for receiving the 6-bit adjusted select vector signal. In one embodiment the 6-bit adjusted vector signal is gray encoded prior to distribution to the data strobe receivers and the mux logic is configured such that it is responsive to the 6-bit gray encoded select signal in such a manner as to select adjacent taps in the 64-tap delay element for each increment or decrement in the 6-bit gray encoded select signal.

In one embodiment, a separate DLL is employed to generate a corresponding 6-bit select vector signal for each of a plurality of data signals D[XX:XX] within a collocated signal group. For example, a first DLL is employed to generate a first 6-bit select vector signal for a first signal group that includes D[15:0], a second DLL is employed for a second signal group that includes D[31:16]. And so on. This embodiment is provided to compensate for cross-die processing variations.

Accordingly, a control section of the integrated circuit employs the known waveform (e.g., DCLK), which is derived from the bus clock BCLK[1:0] and thus exhibits frequency variations due to changes in voltage, temperature, and other factors, to continuously calculate and indicate via a select vector the specific tap in a 64-tap delay element that corresponds to a delay period of two cycles. The select vector is then distributed to receivers on the circuit having replicas of the 64-tap delay element. When a corresponding data strobe DSTBPB[3:0], DSTBNB[3:0] is received by a given receiver, the data strobe DSTBPB[3:0], DSTBNB[3:0] is provided to the 64-tap delay element and pass logic in the receiver locks out subsequent reception of the data strobe DSTBPB[3:0], DSTBNB[3:0] until the delay period transpires. The pass logic receives a pass bus from the select mux that again opens up the receiver for reception of the data strobe DSTBPB[3:0], DSTBNB[3:0].

For teaching purposes, a subset of the signals discussed with reference to FIG. 3 are illustrated and described, however, one skilled in the art will appreciate that the principles taught herein apply to all signals shown in FIG. 3 and extend beyond that to substantially similar source synchronous signals employed to drive address and control signals on a source synchronous bus according to a different protocol as well. The apparatus and methods are employed within a microprocessor or integrated circuit that is required to interface to other devices over a source synchronous system bus. In one embodiment, the x86-compatible bus protocol is provided for by the present invention.

Figure 4:
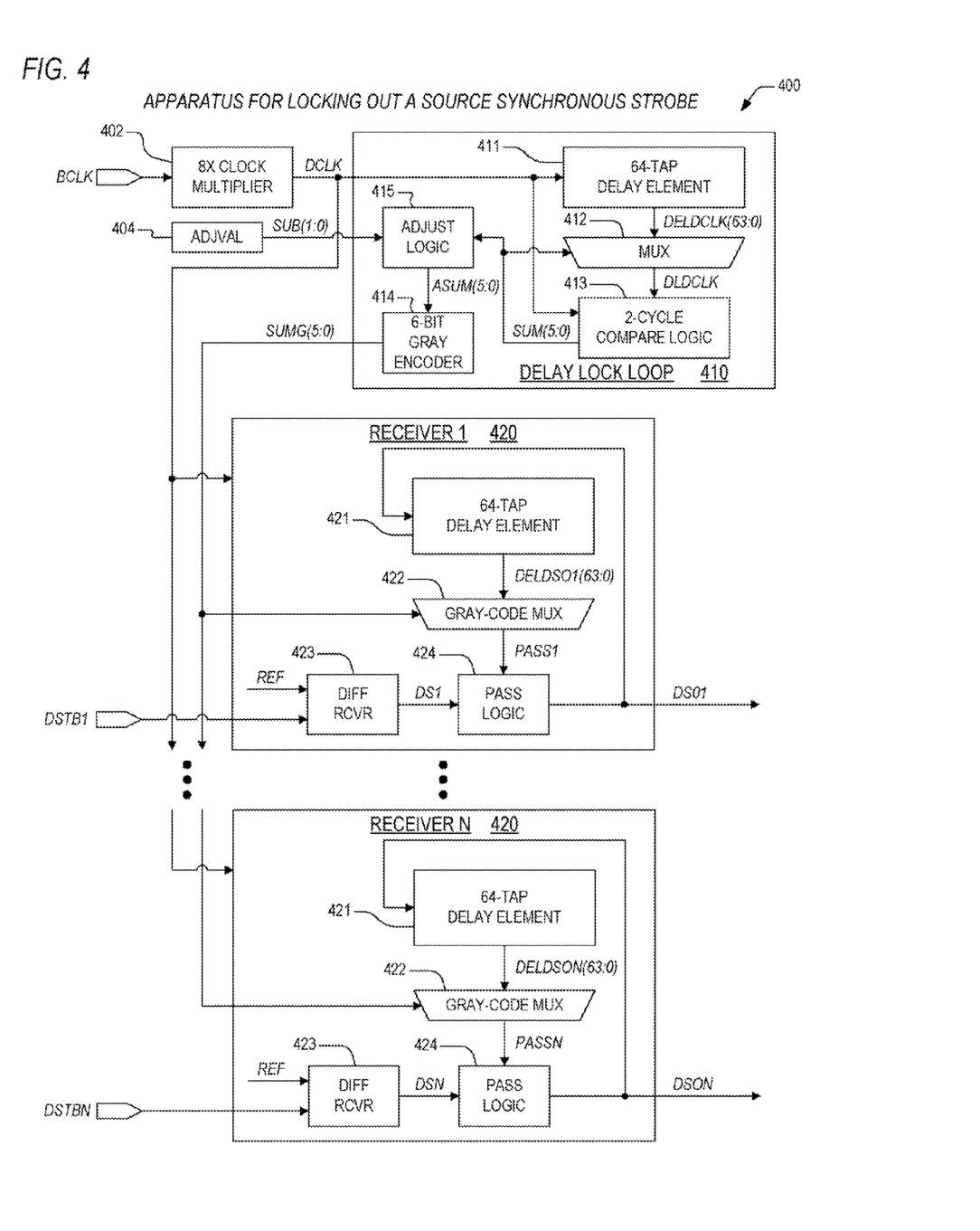
FIG. 4 is a block diagram showing an apparatus for locking out a source synchronous strobe according to the present invention.

Now referring now to FIG. 4, a block diagram is presented illustrating a mechanism 400 for locking out a source synchronous strobe according to the present invention, such as may be employed in a microprocessor or integrated circuit device that communicates over a system bus with other devices to exchange data. The mechanism 400 includes a DLL 410, located in a control section of the integrated circuit (IC). The DLL 410 receives an internally-generated data clock signal DCLK, which is generated by an 8X clock multiplier 402. The DCLK signal is derived from a bus clock signal BCLK, that is provided from off the chip, typically by a clock generator on a motherboard. The DCLK signal is distributed to one or more receivers 420 on the IC as noted above. The receivers 420 are disposed at various points on the IC to receive a synchronous strobe signal DSTB1-DSTBN that corresponds to an associated data, address, or control signal group. The receivers 420 employ DCLK, which, in one embodiment, is eight times the frequency of BCLK, to generate, among other purposes, outgoing synchronous strobes for transmission of information over the bus.

The control section DLL 410 for each signal group includes a 64-tap delay element 411 that receives DCLK from the clock multiplier 402 and that generates 64 successively delayed versions of DCLK in the form of a delayed clock bus signal DELDCLK(63:0). In one embodiment, each stage in the 64-tap delay element 411 includes two inverters (not shown) in series. Accordingly, the aforementioned embodiment has 128 inverters in series where each tap signal DELDCLK(63:0) corresponds to a version of DCLK that is delayed incrementally by the amount of time required to pass through two of the inverters over that of the prior adjacent tap stage.

DELDCLK(63:0) is provided to a 64-to-1 mux 412 and an output DLDCLK of the mux 412 is routed to 2-cycle compare logic 413. The compare logic 413 selects DLDCLK from the 64 tap signals DELDCLK(63:0) by incrementing or decrementing a 6-bit select vector SUM(5:0), which is coupled to a select input on the mux 412. The compare logic 413 counts two successive cycles of DCLK and chooses a vector value SUM(5:0) that selects one of the 64 DELDCLK(63:0) signals which is closest to, but less than, the period of the two successive cycles of DCLK. The value of the vector SUM(5:0) is continually updated to enable the delay computed by the DLL 410 to compensate for variations in the frequency of BCLK, variations in voltage, and variations in temperature. Consequently, the output DLDCLK of the mux 412 represents a dynamically adjusted lockout window for a receiver 420 which is slightly less than ¼ of the period of the bus clock BCLK, that is, a lockout window that is slightly less than the period of any of the strobe signals DSTB1-DSTBN on a quad-pumped source synchronous bus.

In addition, the control section DLL 410 also includes adjust logic 415 that receives SUM(5:0) and performs a subtraction function, in one embodiment, from SUM(5:0). The amount to be subtracted from SUM(5:0) is indicated by the value of signal SUB(1:0), which is received from ADJVAL logic 404. In one embodiment, SUB(1:0) indicates a number of bits to right shift the valued of SUM(5:0). Then the right-shifted version of SUM(5:0) is subtracted from SUM(5:0) by the adjust logic 415 to produce an adjusted 6-bit vector ASUM(5:0). In one embodiment the number of bits to right shift SUM(5:0) is as shown below in Table 1.

TABLE 1

Adjustment Values for 6-Bit Select Vector

| SUB(1:0) VALUE | NUMBER OF BITS TO RIGHT SHIFT |
| --- | --- |
| 00 | 1 BIT |
| 01 | 2 BITS |
| 10 | 3 BITS |
| 11 | 4 BITS |

In one embodiment, the ADJVAL logic 404 comprises one or more metal or poly fuses which are blown during fabrication of the device or IC. An alternative embodiment contemplates the ADJVAL logic circuit 404 as programmable, read-only memory located on the device or IC. A further alternative embodiment comprehends ADJVAL logic 404 that is located off the device or IC and that provides SUB(1:0) as signals to I/O pins (not shown) on the device or IC. Other embodiments of the ADJVAL logic 404 are contemplated as well, to include, but not limited to, a number of signals of SUB which are more or less than two signals. By providing the ADJVAL logic circuit 404 and the adjust logic circuit 415, a designer is allowed to tweak the amount of delay indicated by the DLL via SUM(5:0) in such a manner as to provide compensation for lot variations, process variations, and other factors that may come to light during or following manufacture of the IC. The adjust logic 415 thus generates an adjusted 6-bit select vector ASUM(5:0) by subtracting a right-shifted value of SUM(5:0) from SUM(5:0) as indicated by SUB(1:0).

The DLL in the control section is configured to continuously update SUM(5:0) (and consequently ASUM(5:0) and SUMG(5:0)) to allow for variations in bus clock frequency and changes in delay through each of the stages in the 64-tap delay elements due to temperature and voltage variations during operation.

Thus, the DLL 410 according to the present invention is configured to receive a reference clock signal DCLK and is configured to dynamically and continually generate a select vector SUM(5:0) that enables a mux 412 to select one of a plurality of incrementally delayed versions of a strobe signal DSTB1-DSTBN, where the one of the plurality of incrementally delayed versions lags the strobe signal DSTB1-DSTBN by a time period equal to slightly less than a specified number of cycles of reference clock signal DCLK. The DLL 410 furthermore includes adjust logic 415 that generates and adjusted select vector ASUM(5:0) by subtracting a fractional portion of the value of the select vector SUM(5:0) from itself, as directed by ADJVAL logic 404, which is either on-chip or off-chip. The DLL 410 comprises logic, circuits, devices, or microcode (i.e., micro instructions or native instructions), or a combination of logic, circuits, devices, or microcode, or equivalent elements that are employed to performs the functions specified above according to the present invention. The elements employed to perform these specified functions may be shared with other circuits, microcode, etc., that are employed to perform other functions within the IC or device. According to the scope of the present application, microcode is a term employed to refer to a plurality of micro instructions. A micro instruction (also referred to as a native instruction) is an instruction at the level that a unit executes. For example, micro instructions are directly executed by a reduced instruction set computer (RISC) microprocessor. For a complex instruction set computer (CISC) microprocessor such as an x86-compatible microprocessor, x86 instructions are translated into associated micro instructions, and the associated micro instructions are directly executed by a unit or units within the CISC microprocessor.

In the embodiment shown in FIG. 4, the adjusted select vector ASUM(5:0) is gray encoded by a 6-bit gray encoder 414 to generate a gray encoded select vector signal SUMG(5:0), which is distributed to each of the receivers 420 in its corresponding signal group. The purpose of providing SUMG(5:0) as a gray encoded signal is to minimize the number of state transitions in the signal SUMG(5:0) as it is incremented or decremented in the receivers 420. As one skilled in the art will appreciate, a gray-encoded signal SUMG(5:0) changes state in only one bit position for each commensurate increase/decrease of a corresponding binary signal. And since SUMG(5:0) is employed in each of the receivers 420 as a select signal employed by a mux 422 to select from among 64 different successively delayed versions of a data strobe signal DSTRB1-DSTRBN via a muxing function, the present inventors have noted that inadvertent glitches could appear on the output PASS1-PASSN of the mux 422 if a normal muxing function were to be provided. By providing a gray-encoded select vector SUMG(5:0) and corresponding gray code mux 422, described below, spurious outputs are precluded according to the present invention.

Each of the receivers 420 receives a data strobe signal DSTB1-DSTBN from off chip. The receivers 420 each have identical circuitry for purposes of the present invention, the difference being that they receive different strobe signals DSTB1-DSTBN and generate different strobe outputs DSO1-DSON. Accordingly, a description follows for RECEIVER 1 420 where it is noted that that the description of RECEIVER 1 420 is applicable to the other receivers 420 as well.

At the receiver 420, the data strobe signal DSTB1 is coupled to a differential receiver 423 that is triggered when the value (i.e., voltage or current) of DSTB1 exceeds or falls below a reference value REF. An output DS1 of the differential receiver 423 is provided to pass logic 424. In one embodiment, the pass logic 424 is configured to lock out reception of DS1 for a period that is equal to or less than two cycles of DCLK, as will be described further below. The pass logic 424 provides an output strobe signal DSO1 that is coupled to the input of 64-tap delay element 421, which is a replica of the delay element 411 in the control section DLL 410 in the sense that the taps of the 64-bit delay element 421 generate 64 delayed versions of the output strobe signal DSO1, which is coupled to an input of the delay element 421, where the delayed versions DELDSO1(63:0) of DSO1 each have time delays substantially equal to their corresponding delayed versions DELDCLK(63:0) of DCLK that are generated by the delay element 410 in the control section.

In operation, when the synchronous strobe DSTB1 transitions from one state to the next state, the state of the differential receiver output DS1 is allowed to pass through the pass logic 424 to output DSO1. In one embodiment, the output signal DSO1 is a complement in state of the input strobe signal DSTB1. A pass signal PASS1 is then deasserted, thus disabling the pass logic. After the delay of approximately 2 DCLKs directed by SUMG(5:0), PASS1 is again asserted, thus re-enabling the pass logic 424. When the receiver 420 is open, DS1 passes through to the output DSO1, and DSO1 is provided to the input of the replica 64-tap delay element 421. Upon transition of DSO1, the pass logic 424 then locks out DS1 until PASS1 is again asserted, thus indicating that a period of time has transpired which is slightly less than a delay equal to two cycles of DCLK. To indicate this delay, a 6-bit gray encoded select signal SUMG(5:0), as described above, directs a 64-to-1 mux 422 to select one of the delayed versions DELDSO1(63:0) of DSO1, thus asserting PASS1. PASS1, when asserted, directs the pass logic 424 to open up the receiver 420 to allow a subsequent transition of DS1 to pass through to DSO1. The pass logic 424 keeps the receiver 420 open when PASS1 is asserted.

The receivers 420 each comprise logic, circuits, devices, or microcode (i.e., micro instructions or native instructions), or a combination of logic, circuits, devices, or microcode, or equivalent elements that are employed to performs the functions specified above according to the present invention. The elements employed to perform these specified functions may be shared with other circuits, microcode, etc., that are employed to perform other functions within the IC or device.

As previously noted, the DLL 410 in the control section is configured to continuously update SUM(5:0) (and consequently ASUM(5:0) and SUMG(5:0)) to compensate for variations in bus clock frequency and changes in delay through each of the stages in the 64-tap delay elements 411, 421 due changes in temperature and voltage during operation.

In one embodiment, a single control section DLL 410 on the device or IC is configured to receive the reference clock signal DCLK and to distribute a single select vector SUMG(5:0) to a plurality of receivers 420 that are disposed in different locations on the IC.

In an embodiment that is configured to compensate for cross-die fabrication variations, a plurality of DLLs 410 are disposed at different locations on the chip that are collocated with a set of associated signal groups and corresponding synchronous strobes. According to this embodiment, each of the DLLs 410 generate a select vector SUMG(5:0), which is then provided to corresponding receivers 420 that are in substantially the same location on the chip.

Figure 5:
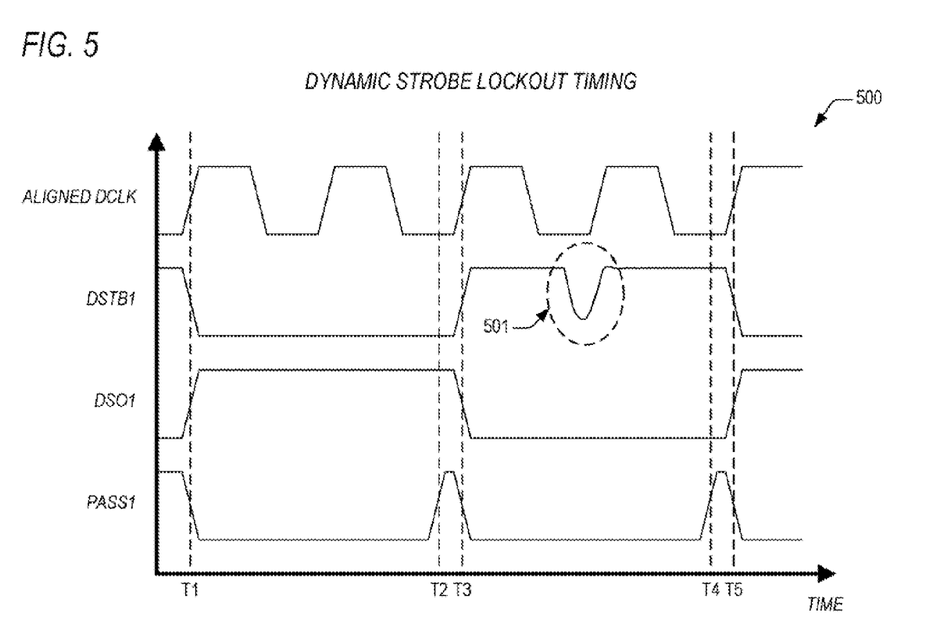
FIG. 5 is a timing diagram illustrating how the apparatus of FIG. 4 is employed within a synchronous strobe receiver according to the present invention to preclude erroneous indications resulting from bus noise in a microprocessor system that employs source synchronous data, address, and/or control buses.

Now turning to FIG. 5, a timing diagram 500 is presented illustrating how the apparatus of FIG. 4 is employed within a synchronous strobe receiver 420 according to the present invention to preclude erroneous indications resulting from bus noise in a microprocessor or other system that employs source synchronous bus strobe technology. The timing diagram 500 depicts a data strobe input signal DSTB1, a pass logic output signal DSO1, and a pass logic enable signal PASS1, which represent like-named signals discussed with reference to RECEIVER 1 420 of FIG. 4. For reference purposes, an aligned version of a reference clock; signal ALIGNED DCLK is shown as well, although it is noted that the reference signal DCLK is not aligned with any of the aforementioned signals DSTB1, DSO1, PASS1 during operation of the receiver 420.

Immediately prior to time T1, PASS1 is shown asserted, indicating that the receiver is open and the state of DSTB1 is allowed to pass through the pass logic 424 to output DSO1.

At time T1, DSTB1 transitions through the reference value, thus causing the output DSO1 of the differential receiver 423 to transition to a logic high level. In the diagram 500, DSO1 is depicted as being complementary in state to DSTB1, although other embodiments are contemplated. DSO1 is routed to the delay element 421, thus initiating generation of 64 delayed versions DELDSON(63:0). At time T1, PASS1 is also deasserted, thus locking out subsequent transitions of DSTB1 that may be caused by a glitch between times T1 and T2.

The select vector value SUMG(5:0) provided to the receiver mux 422 selects a delayed version of DSO1 that is slightly less than two cycles of DCLK which, at time T2, causes PASS1 to be asserted, thus opening up the receiver 420.

At time T3, DSTB1 transitions to a logic high level and DSO1 thus transitions to a logic low level. At the time of transition, PASS1 is deasserted, thus locking out the receiver 420 again against any glitch 501 that might occur between T3 and T4, the interval again being slightly less then the period of two cycles of the reference clock signal DCLK. For teaching purposes, a glitch 501 is shown between times T3 and T4, such time being slightly less than two cycles of DCLK, where the glitch 501 is shown to be occurring approximately midway between, which is the time at which associated data signals (not shown) would be transitioning states. Since the receiver 420 is locked, the pass logic 424 does not pass the glitch 501 on through to the output DSO1. Although the T1-T2 and T3-T4 intervals appear to be roughly equivalent, they may not be exactly equal because a corresponding control DLL 410 continually updates the select vector value SUMG(5:0), thus compensating for variations in bus clock frequency, voltage, and temperature.

At time T4, PASS1 is again asserted, opening up the receiver 420.

At time T5, DSTB1 transitions low, DSO1 transitions high, and PASS1 is deasserted, thus starting another lockout delay slightly less than two cycles of DCLK.

Figure 6:
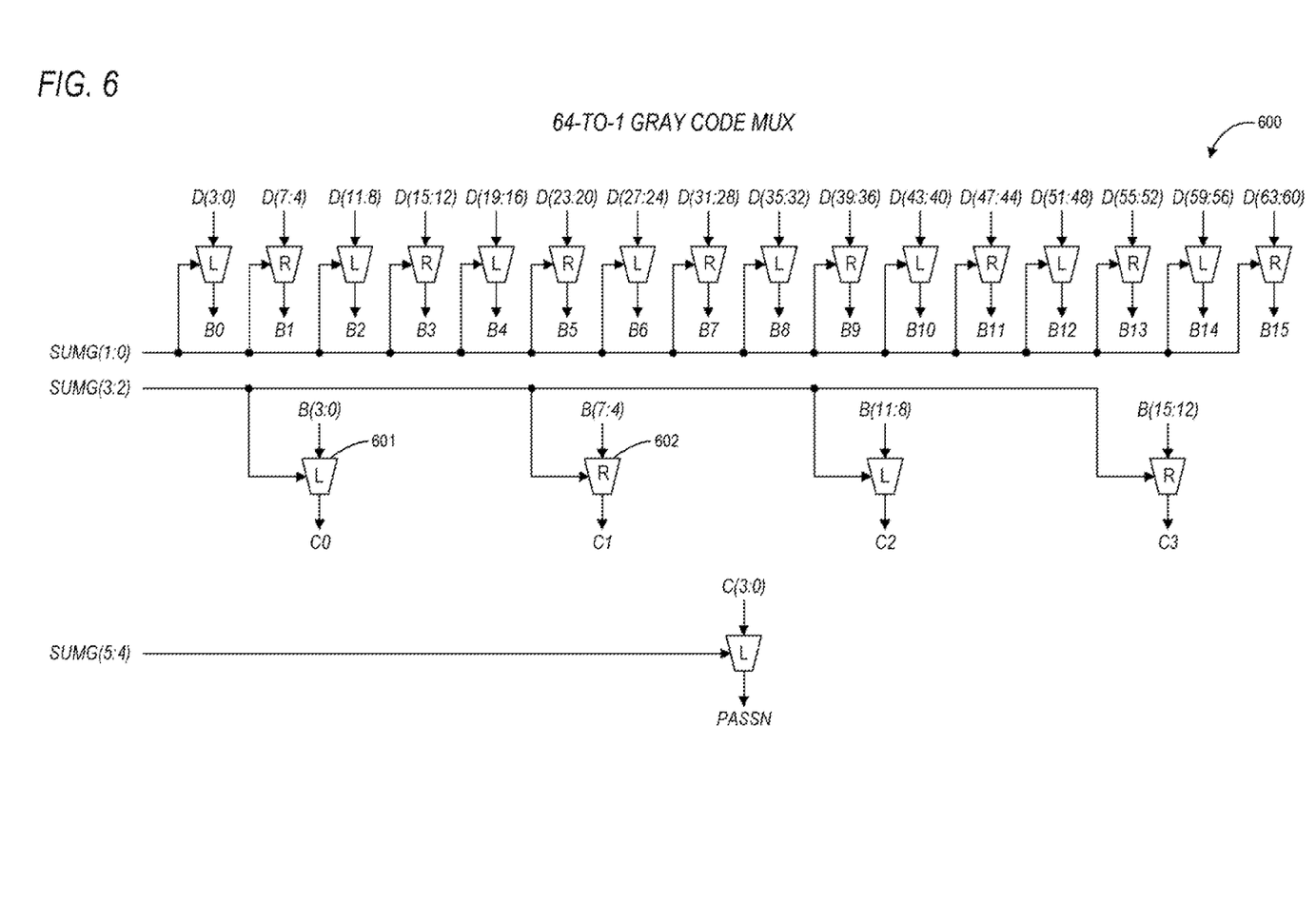
FIG. 6 is a block diagram detailing a 64-to-1 gray code mux according to the present invention.

Now turning to FIG. 6, a block diagram is presented of a 64-to-1 gray code mux 600 according to the present invention as is disposed in each of the receivers 420 of FIG. 4. The mux 600 includes a parallel configuration of left 4-to-1 gray code muxes 601 and right 4-to-1 gray code muxes 602 as shown, and as will be individually described with reference to FIGS. 4 and 5, respectively. A first left gray code 4-to-1 mux 601 receives the lower 4 bits D(3:0) of a 64-bit delayed strobe signal D(63:0), such as signal DELDSO1(63:0) received from the 64-tap element in RECEIVER 1 420 of FIG. 4. The first left mux 601 generates a first output B0 responsive to the state of encoded select, vector bits SUMG(1:0). D0 is a delayed version of a data strobe signal which is delayed by one delay element. D1 is a version delayed by two delay elements. D2 is a version delayed by three delay elements. And so on. Finally, D63 is a version delayed by 64 delay elements The next four higher order bits, D(7:4) are input to a first right 4-to-1 gray code mux 602, which generates a second output B1 responsive to the state of select bits SUMG(1:0). Likewise, the remaining bits D(63:8) of the delayed strobe signal D(63:0) are provided to like-configured left and right muxes 601, 602, respectively, as shown in the diagram, where each of the muxes 601, 602 are responsive to select signals SUMG(1:0) and where each provide a corresponding output B2-B15.

The first four outputs B(3:0) are provided to another left gray encoded 4-to-1 mux 601 which is responsive to the state of select hits SUMG(3:2), and which generates output C0. Likewise, the remaining outputs B(15:4) are provided, in groups of four bits, to alternating left and right muxes 601, 602 as shown in the diagram, each responsive to the state of select signals SUMG(3:2) and each producing outputs C(3:1).

Outputs C(3:0) are provided to a final left gray code 4-to-1 mux 601, which is responsive to the state of select signals SUMG(5:4), and which produces signal PASSN. PASSN is selected version of a received synchronous strobe signal, like signals DSTRB1-DSTRBN of FIG. 4, which is delayed slightly less than the period of two cycles of DCLK, and which is reduced by an amount indicated by the adjustment vector signal SUB(1:0). When PASSN is asserted, the pass logic is directed to open up the receiver to allow for subsequent transitions of the data strobe.

Figure 7:
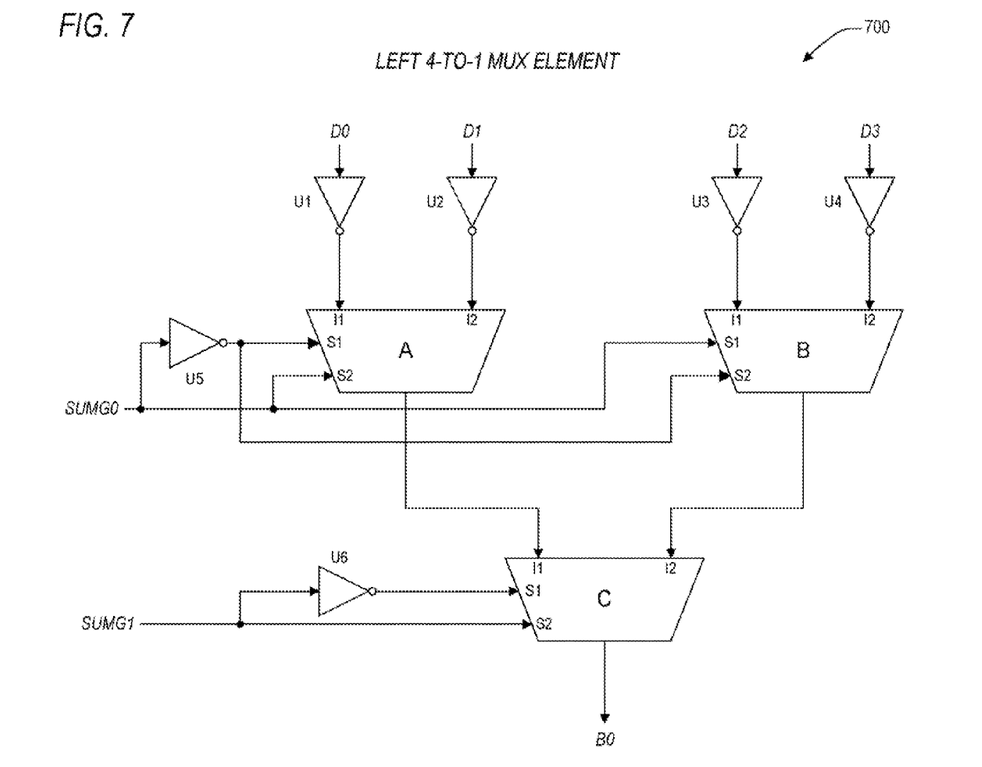
FIG. 7 is a block diagram depicting a left 4-to-1 mux element of the gray code mux of FIG. 6.
Figure 8:
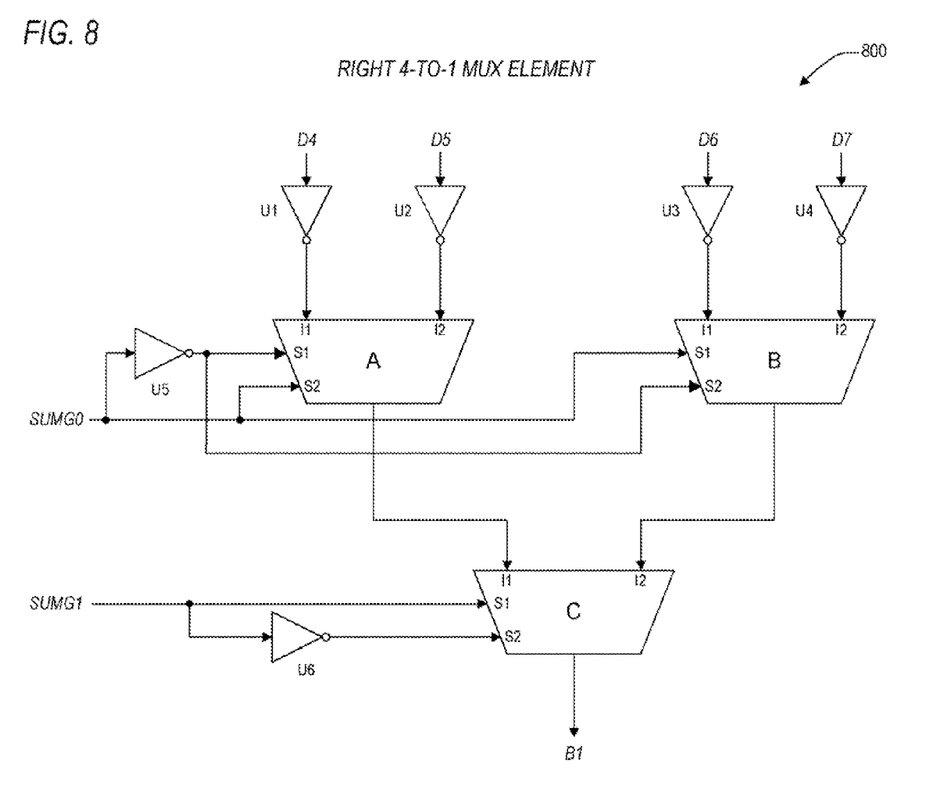
FIG. 8 is a block diagram illustrating details of a right 4-to-1 mux element of the gray code mux of FIG. 6.

To preclude glitches, and to preclude generation of a spurious pass signal PASSN, attention is now directed to FIGS. 7 and 8. In FIG. 7, a left gray code 4-to-1 mux element 700 is shown, like the first left gray code 4-to-1 mux 601 of FIG. 6. To The left gray code 4-to-1 mux 700 includes three 2-to-1 muxes, A, B, C. Signal D0 is coupled to an inverter U1, whose output is coupled to input I1 of mux A. Signal D1 is coupled to an inverter U2, whose output is coupled to input I2 of mux A. Signal D2 is coupled to an inverter U3, whose output is coupled to input I1 of mux B. And signal D3 is coupled to an inverter U4, whose output is coupled to input I2 of mux B. The output of mux A is coupled to input I1 of mux C and the output of mux B is coupled to input I2 of mux C. SUMG0 is coupled to select pin S2 of mux A and to select S1 of mux B. SUMG0 is routed through an inverter U5 and the output of the inverter U5 is routed to S1 on mux A and S2 on mux B. SUMG1 is coupled to S2 on mux C and to inverter U6, whose output is coupled to S1 on mux C. Mux C provides the output B0.

Operationally, since SUMG(5:0) is gray encoded, only one of its bits changes state with each increment/decrement of its corresponding binary select signal ASUM(5:0). Hence, if both SUMG0 and SUMG1 are low, D0 is routed through muxes A and C to output B0. If SUMG0 goes high, then D1 is routed through to B0. If, rather, SUMG1 goes high, then D2 is routed through muxes B and C. And if both SUMG0 and SUMG1 are both high, then D3 is routed through muxes B and C to output B0. Since only one of the select bits SUMG (1:0) can change state with an increment or decrement of ASUM(5:0), there are no spurious outputs generated on output B0.

FIG. 8 depicts a right gray code 4-to-1 mux 800, like those like-named elements 602 shown in FIG. 6. The elements and signals of the mux 800 of FIG. 8 are substantially similar in configuration and operation to those like numbered elements of the mux 700 of FIG. 7. The difference between the left mux 700 of FIG. 7 and the right mux 800 of FIG. 8 is that complementary versions of SUMG1 are routed to mux C in FIG. 8 as opposed to the configuration shown in FIG. 7.

When a 64-to-1 gray code mux 600 according to the present invention is provided in a receiver 420 to lock out a synchronous strobe signal, spurious lockouts and enablements of the receiver 420 are precluded because only one bit of the encoded 6-bit select vector signal SUMG(5:0) is allowed to change for each increment or decrement of the adjusted select vector signal ASUM(5:0), thus allowing only one of the 64 delayed versions of the strobe signal to pass through to signal PASS#.

One advantage of the present invention is that integrated circuits accordingly configured can be fabricated within packages that have looser noise constraints over those which are presently required. Because the present invention locks out reception of a synchronous strobe receiver for an optimized period of time, the noise that is conveyed on strobe signals through the packaging for the integrated circuits is also locked out. Consequently, integrated circuits according to the present invention can employ cheaper packaging technologies, that is, packages with fewer layers, tighter signal trace groupings, and sub-optimal noise characteristics.

Although the present invention and its objects, features, and advantages have been described in detail, other embodiments are encompassed by the invention as well. For example, although elements of the present invention have been presented in terms of receivers disposed within an integrated circuit, the present inventors note that such a configuration is only one of the proposed embodiments. It is also comprehended that the present invention may be configured as receivers and DLLs disposed in a plurality of integrated circuits or other devices that are provides on a printed circuit board or substantially similar scheme of interconnection.

In addition, although the present invention contemplates embodiments that are provided to preclude source synchronous strobe detection errors in an x86-compatible microprocessor environment, it is noted that embodiments beyond such an environment are considered useful as well. For example, an application-specific signal processor or microcontroller may communicate data to other devices via a source synchronous protocol. Accordingly, such devices would also benefit from provision of the apparatus and methods disclosed herein.

Furthermore, it is noted that the reference clock DCLK is employed herein as the signal which is reflective of variations in bus clock frequency, voltage, and temperature, and is thus suitable for generation of the vector indicating the delay required for lockout of a receiver. In addition, two cycles of DCLK are considered to be the most effective time period in which to lock out a receiver according to the present invention. However, it is noted that these details are provided only to teach the essential elements of the present invention, as it is disposed in an x86-compatible quad-pumped source synchronous environment. In other applications, different reference signals and different delays may be desirable, and the principles of the present invention are applicable to such applications. For example, it may be effective to choose a reference signal that is 16 times the frequency of a master clock signal, and to indicate a delay that is slightly less than 8 cycles of the reference signal.

Moreover, although the present invention has been characterized by a control section and receivers that have delay elements therein comprising the same number of taps, as the 64-tap delay elements in one embodiment, the present inventors note that such is not a requirement within the scope of the present invention. Rather, what is necessary is that the control section provide sufficient taps in its delay-locked loop to measure and indicate some number of cycles of the reference clock. And what is necessary is that the receivers provide sufficient number of taps in their delay elements to create a lockout delay whose length is based upon the number of cycles measured and indicated in the control delay-locked loop. For example, one embodiment of the present invention contemplates a control section delay-locked loop having a 32-tap delay element that measures one cycle of the DCLK and which provides signal vectors commensurate with that measurement. To generate a lockout delay in a receiver in this embodiment, the receiver may comprise a 64-tap delay element and double the value of the provided signal vector in order to generate a lockout delay that is slightly less than two cycles of DCLK. Other variations are comprehended as well.

Those skilled in the art should appreciate that they can readily use the disclosed conception and specific embodiments as a basis for designing or modifying other structures for carrying out the same purposes of the present invention, and that various changes, substitutions and alterations can be made herein without departing from the scope of the invention as defined by the appended claims.

What is claimed is:

1. An apparatus for precluding reception errors in an source synchronous receiver, the apparatus comprising:
   a delay-locked loop, configured to receive a reference clock signal, and configured to generate a select vector signal and an encoded select vector signal, wherein said encoded select vector signal indicates a lockout time period, and wherein said select vector signal is employed to select one of a plurality of successively delayed versions of said reference clock signal that lags said reference clock signal by a prescribed number of cycles of said reference clock signal, and wherein said lockout time period is slightly less than said prescribed number of cycles of said reference clock signal, said delay-locked loop comprising:
      a gray encoder, configured to generate said encoded select vector signal according to a gray code; and
   one or more strobe receivers, each coupled to said delay-locked loop, and said each configured to receive said encoded select vector signal and a corresponding strobe signal, wherein said each is configured to lock out reception of said corresponding strobe signal for said lockout time period following transition of said corresponding strobe signal, and wherein said encoded select vector signal is employed to determine said lockout time period by selecting one of a plurality of successively delayed versions of said corresponding strobe signal, and wherein said each comprises a gray code mux to select said one of a plurality of successively delayed versions of said corresponding strobe signal according to said encoded select vector signal.

2. The apparatus as recited in claim 1, wherein said select vector signal and said encoded select vector signal are continually updated.

3. The apparatus as recited in claim 1, wherein said delay-locked loop comprises:
   a delay element having a first plurality of taps, each of said first plurality of taps corresponding to each of said plurality of successively delayed versions of said reference clock signal.

4. The apparatus as recited in claim 3, wherein said each of said first plurality of taps comprises two serially cascaded inverters.

5. The apparatus as recited in claim 3, wherein said each of said one or more strobe receivers comprises:
   a replica delay element having a second plurality of taps, each of said second plurality of taps corresponding to each of said plurality of successively delayed versions of said corresponding strobe signal, wherein said first and second plurality of taps are equal in number.

6. The apparatus as recited in claim 1, wherein the source synchronous receiver is coupled to a quad-pumped source synchronous bus.

7. The apparatus as recited in claim 1, wherein said reference clock signal is derived from a bus clock signal, and wherein said prescribed number of cycles comprises two cycles.

8. The apparatus as recited in claim 1, wherein said plurality of successively delayed versions of said reference clock signal are input to a mux, and wherein said select vector signal is provided to a select input of said mux, whereby said mux outputs said one of said plurality of successively delayed versions of said reference clock signal.

9. The apparatus as recited in claim 1, wherein said plurality of successively delayed versions of said corresponding strobe signal are input to said gray code mux, and wherein said encoded select vector signal is provided to a select input of said gray code mux, whereby said gray code mux outputs said one of said plurality of successively delayed versions of said corresponding strobe signal.

10. The apparatus as recited in claim 1, wherein said gray code mux comprises a 64-to-1 gray code mux.

11. A microprocessor apparatus for locking out a source synchronous strobe receiver, the microprocessor apparatus comprising:
   a delay-locked loop, configured to receive a reference clock signal, and configured to generate a select vector signal and an encoded select vector signal, wherein said encoded select vector signal indicates a lockout time period, and wherein said select vector signal is employed to select one of a plurality of successively delayed versions of said reference clock signal that lags said reference clock signal by a prescribed number of cycles of said reference clock signal, and wherein said lockout time period is slightly less than said prescribed number of cycles of said reference clock signal, said delay-locked loop comprising:
      a delay element having a first plurality of taps, each of said first plurality of taps corresponding to each of said plurality of successively delayed versions of said reference clock signal; and
      a gray encoder, configured to generate said encoded select vector signal according to a gray code; and
   a strobe receiver, coupled to said delay-locked loop, and configured to receive said encoded select vector signal and a strobe signal, and configured to lock out reception of said strobe signal for said lockout time period following transition of said strobe signal, and wherein said encoded select vector signal is employed to determine said lockout time period by selecting one of a plurality of successively delayed versions of said strobe signal, said strobe receiver comprising:
- a replica delay element having a second plurality of taps, each of said second plurality of taps corresponding to each of said plurality of successively delayed versions of said strobe signal, wherein said first and second plurality of taps are equal in number; and
- a gray code mux, configured to select said one of a plurality of successively delayed versions of said strobe signal according to said encoded select vector signal.

12. The microprocessor apparatus as recited in claim 11, wherein said select vector signal and said encoded select vector signal are continually updated.

13. The microprocessor apparatus as recited in claim 11, wherein said each of said first plurality of taps comprises two serially cascaded inverters, and wherein said each of said second plurality of taps comprises two serially cascaded inverters.

14. The microprocessor apparatus as recited in claim 11, wherein the source synchronous strobe receiver is coupled to a quad-pumped source synchronous bus.

15. The microprocessor apparatus as recited in claim 11, wherein said reference clock signal is derived from a bus clock signal, and wherein said prescribed number of cycles comprises two cycles.

16. The microprocessor apparatus as recited in claim 11, wherein said plurality of successively delayed versions of said reference clock signal are input to a mux, and wherein said select vector signal is provided to a select input of said mux, whereby said mux outputs said one of said plurality of successively delayed versions of said reference clock signal.

17. The microprocessor apparatus as recited in claim 11, wherein said plurality of successively delayed versions of said strobe signal are input to a said gray code mux, and wherein said encoded select vector signal is provided to a select input of said gray code mux, whereby said gray code mux outputs said one of said plurality of successively delayed versions of said strobe signal.

18. The microprocessor apparatus as recited in claim 11, wherein said gray code mux comprises a 64-to-1 gray code mux.

19. A method for lockout of a source synchronous strobe receiver, comprising:
- first generating successively delayed versions of a reference clock signal and selecting one of the successively delayed versions of the reference clock signal that lags the reference clock signal by a prescribed number of cycles of the reference clock signal;
- first indicating the one of the successively delayed versions of the reference clock signal via a select vector;
- second generating a gray encoded select vector that indicates a lockout time period; and
- in a strobe receiver, locking out reception of a strobe signal for the lockout time period following transition of the strobe signal, wherein said locking out comprises:
  - third generating successively delayed versions of the strobe signal and employing the gray encoded select vector to determine the lockout time period by selecting one of the successively delayed versions of the strobe signal.

20. The method as recited in claim 19, further comprising:
continually updating the select vector and the encoded select vector.

21. The method as recited in claim 19, wherein said first generating comprises:
first employing a delay element having a first plurality of taps, each of the first plurality of taps corresponding to each of the plurality of successively delayed versions of the reference clock signal.

22. The method as recited in claim 21, wherein said second generating comprises:
second employing a replica delay element having a second plurality of taps, each of the second plurality of taps corresponding to each of the plurality of successively delayed versions of the strobe signal, wherein the first and second plurality of taps are equal in number.

23. The method as recited in claim 19, wherein said first generating comprises:
deriving the reference clock signal from a bus clock signal, and prescribing the prescribed number of cycles as two cycles.

24. The method as recited in claim 19, wherein said first generating comprises:
first providing the plurality of successively delayed versions of the reference clock signal as inputs to a mux, and second providing the select vector to a select input of the mux, whereby the mux outputs the one of the plurality of successively delayed versions of the reference clock signal.

25. The method as recited in claim 19, wherein said third generating comprises:
first providing the plurality of successively delayed versions of the strobe signal as inputs to a gray code mux, and second providing the encoded select vector to a select input of the gray code mux, whereby the gray code mux outputs the one of the plurality of successively delayed versions of the strobe signal.

* * * * *